(12) United States Patent
Zhang et al.

(10) Patent No.: US 9,209,308 B2
(45) Date of Patent: Dec. 8, 2015

(54) THIN FILM TRANSISTOR, ARRAY SUBSTRATE AND METHOD FOR MANUFACTURING THE SAME, DISPLAY DEVICE

(71) Applicant: BOE Technology Group Co., Ltd., Beijing (CN)

(72) Inventors: Xuehui Zhang, Beijing (CN); Xiang Liu, Beijing (CN); Jainshe Xue, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 13/985,196

(22) PCT Filed: Nov. 8, 2012

(86) PCT No.: PCT/CN2012/001510
§ 371 (c)(1),
(2) Date: Aug. 13, 2013

(87) PCT Pub. No.: WO2014/015453
PCT Pub. Date: Jan. 30, 2014

(65) Prior Publication Data
US 2014/0077213 A1    Mar. 20, 2014

(30) Foreign Application Priority Data
Jul. 25, 2012    (CN) .......................... 2012 1 0260931

(51) Int. Cl.
*H01L 21/84* (2006.01)
*H01L 29/04* (2006.01)
*H01L 29/786* (2006.01)
*H01L 27/12* (2006.01)
*H01L 29/66* (2006.01)
(Continued)

(52) U.S. Cl.
CPC ........ *H01L 29/78678* (2013.01); *H01L 27/124* (2013.01); *H01L 27/1214* (2013.01);
(Continued)

(58) Field of Classification Search
CPC ............ H01L 27/1214; H01L 27/1225; H01L 27/124; H01L 27/1259; H01L 29/458; H01L 29/66765; H01L 29/78678
USPC ............................................ 257/59; 438/158
See application file for complete search history.

(56) References Cited

U.S. PATENT DOCUMENTS

| 2006/0139548 A1 | 6/2006 | Ahn |
| 2006/0146213 A1 | 7/2006 | Ahn et al. |

(Continued)

FOREIGN PATENT DOCUMENTS

| CN | 1794076 A | 6/2006 |
| CN | 1797151 A | 7/2006 |

(Continued)

OTHER PUBLICATIONS

Second Office Action issued by the Chinese Patent Office for Chinese Patent Application No. 2012102609316 dated May 29, 2014, 4pgs.
(Continued)

*Primary Examiner* — Long K Tran

(57) ABSTRACT

There is provided a thin film transistor, comprising a substrate (1) and a gate layer (3), a gate insulating layer (4), an active layer (5), an electrode metal layer (8) and a passivation layer (9) which are formed on the substrate (1) in sequence; the electrode metal layer (8) comprises a source electrode (8a) and a drain electrode (8b), which are separated from each other with a channel region being defined therebetween; between the gate layer (3) and the substrate (1), there is formed a first transparent conductive layer (2); between the active layer (5) and the electrode metal layer (8), there is formed a second transparent conductive layer (7). The transparent conductive layers (2, 7) are added so that adhesive force between the gate metal layer (3) and the substrate (1) is enhanced, diffusion of the electrode metal to the active layer (5) is prevented.

13 Claims, 7 Drawing Sheets

(51) Int. Cl.
*H01L 29/45* (2006.01)
*H01L 29/49* (2006.01)

(52) U.S. Cl.
CPC ........ *H01L 27/1259* (2013.01); *H01L 27/1288* (2013.01); *H01L 29/458* (2013.01); *H01L 29/4908* (2013.01); *H01L 29/66742* (2013.01); *H01L 29/66765* (2013.01); *H01L 29/78693* (2013.01); *H01L 27/1225* (2013.01)

(56) References Cited

U.S. PATENT DOCUMENTS

| | | | |
|---|---|---|---|
| 2010/0075450 | A1 | 3/2010 | Choi et al. |
| 2011/0045666 | A1* | 2/2011 | Whang et al. ............... 438/587 |
| 2011/0284857 | A1* | 11/2011 | Lee et al. ..................... 257/59 |
| 2014/0077213 | A1 | 3/2014 | Zhang et al. |

FOREIGN PATENT DOCUMENTS

| | | |
|---|---|---|
| CN | 101075579 A | 11/2007 |
| CN | 101685229 A | 3/2010 |
| CN | 102769040 A | 11/2012 |
| CN | 202712193 U | 1/2013 |
| KR | 20060073373 A | 6/2006 |
| KR | 20090104146 A | 10/2009 |

OTHER PUBLICATIONS

English translation of Second Office Action issued by the Chinese Patent Office for Chinese Patent Application No. 2012102609316 dated May 29, 2014, 4pgs.

English abstract of CN 202712193 (U), listed above, 1 page.
English translation of CN 102769040 (A), listed above, 34 pages.
English translation of CN 101685229 (A), listed above, 22 pages.
English translation of CN 101075579 (A), listed above, 56 pages.
English translation of CN 1797151 (A), listed above, 40 pages.
English translation of CN 1794076 (A), listed above, 33 pages.
First Office Action (Chinese language) regarding CN 201210260931.6 issued by the State Intellectual Property Office ("Sipo"), Jan. 28, 2014, 4 pages.
English translation of the First Office Action regarding CN 201210260931.6, 4 pages.
PCT International Search Report (ISR in Chinese language) regarding PCT/CN2012/001510, rendered Jul. 25, 2012, 15 pages.
Office Action issued by the Korean Patent Office for Korean Patent Application No. 10-2013-7018073 issued Jun. 26, 2014, 4pgs.
English translation of Office Action issued by the Korean Patent Office for Korean Patent Application No. 10-2013-7018073 issued Jun. 26, 2014, 2pgs.
International Preliminary Report on Patentability issued by the International Bureau of WIPO on Jan. 27, 2015 for International Application No. PCT/CN2012/001510, 12 pages.
Second Office Action issued by Korean Intellectual Property Office, in Korean application No. 10-2013-7018073, dated Dec. 24, 2014; 4 pages.
English translation of Second Office Action issued by Korean Intellectual Property Office, in Korean application No. 10-2013-7018073, dated Dec. 24, 2014; 3 page.

* cited by examiner

THIN FILM TRANSISTOR, ARRAY SUBSTRATE AND METHOD FOR MANUFACTURING THE SAME, DISPLAY DEVICE

CROSS REFERENCE TO RELATED APPLICATIONS

This application is based on International Application No. PCT/CN2012/001510 filed on Nov. 8, 2012, which claims priority to Chinese National Application No. 201210260931.6, filed on Jul. 25, 2012, the contents of which are incorporated herein by reference.

TECHNICAL FIELD

Embodiments of the present invention relate to a thin film transistor, an array substrate and a method for manufacturing the same, a display device.

BACKGROUND

Thin Film Transistor Liquid Crystal Displays (TFT-LCDs) have characteristics of small volume, low power consumption, irradiation-free, etc., and play a leading role in the current market of flat panel displays. For TFT-LCDs, thin film transistor array substrates and the manufacturing process thereof determine product performance, yield and price. The display effect of common twisted nematic (TN) mode liquid crystal displays has been unable to meet requirements of the market. Currently, the major manufacturers are applying various wide-viewing-angle display technologies offering better display effect to mobile products gradually, and these technologies comprise, such as, In-Plane Switching (IPS), Vertical Alignment (VA), Advanced-Super Dimensional Switching (AD-SDS, also briefly called as ADS), etc.

In the ADS mode, a multi-dimensional electric field is formed by an electric field produced at edges of slit electrodes within the same plane and an electric field produced between a layer of the slit electrodes and a layer of a plate-like electrode, so as to allow liquid crystal molecules at every alignment within a liquid crystal cell, which are located directly above the electrode and between the slit electrodes, to be rotated, and thereby the work efficiency of liquid crystals is enhanced and the transmissive efficiency is increased.

With decreased resistance of an electrode material, resistance/capacitance time delay (RC delay) can be reduced, thereby helpful to improve aperture ratio. When the drive manner is changed from a bilateral drive to a unilateral drive, the number of driving ICs can be reduced in half. Therefore, it is necessary for the industry to develop electrode materials with low resistance. At present, when a material with low resistance is used as the electrode material, the following issues occur. The material with low resistance is such as copper possessing resistivity of merely $2\mu\Omega\cdot cm$, which has a small adhesive force with a substrate and a semiconductor material so that poor contact of the electrode material occurs easily, and will react with Si at a lower temperature and may diffuse into an active layer, thereby affecting the performance of the device.

SUMMARY

Embodiments of the present invention provide a thin film transistor, an array substrate and manufacturing method thereof and a display device, which can solve technical problems that a low-resistance material is diffused toward an active layer and has a poor adhesion with a substrate and a semiconductor material, etc.

In a first aspect of the invention, there is provided a thin film transistor, comprising a gate electrode, a gate insulating layer, an active layer, an electrode metal layer and a passivation layer which are formed on a substrate; wherein the electrode metal layer comprises a source electrode and a drain electrode, and the source electrode and the drain electrode are separated from each other with a channel region being defined therebetween; between the active layer and the electrode metal layer, there is formed a second transparent conductive layer.

In the thin film transistor, for example, between the gate electrode and the substrate, there is formed a first transparent conductive layer.

In the thin film transistor, for example, materials for the gate electrode and the electrode metal layer is copper; and between the first transparent conductive layer and the gate electrode and/or between the second transparent conductive layer and the electrode metal layer, respectively, there may be formed a metal layer. For example, a material for the metal layer is one of molybdenum, aluminum, neodymium, titanium, or alloys thereof.

In the thin film transistor, for example, the active layer is of an amorphous silicon material or an oxide semiconductor material.

In the thin film transistor, for example, first transparent conductive layer and/or the second transparent conductive layer are/is formed of zinc oxide, indium tin oxide, indium zinc oxide, polymer ethylenedioxy thiophene or a grapheme material.

In a second aspect of the invention, there is further provided a manufacturing method of a thin film transistor, comprising the following steps: forming a gate electrode on a substrate; forming a gate insulating layer and an active layer on the gate electrode; forming a second transparent conductive layer on the gate insulating layer and the active layer, and a source electrode and a drain electrode that are located on the second transparent conductive layer and separated from each other; and forming a passivation layer on the source electrode and the drain electrode, and the second transparent conductive layer.

In the manufacturing method, for example, the forming of the gate electrode on the substrate comprises: forming a first transparent conductive layer on the substrate firstly to function as an adhesion enhancing layer between the gate electrode and the substrate.

In a third aspect of the invention, there is provided an array substrate, comprising any of the above-mentioned thin film transistors or the thin film transistor manufactured by any of the above manufacturing methods.

In the array substrate, for example, on the array substrate, there are provided a pixel electrode and a common electrode, the pixel electrode and the common electrode are disposed in different layers of the array substrate with an insulating layer being provided between the pixel electrode and the common electrode, and the shape of the pixel electrode is in a slit configuration.

In the array substrate, for example, the common electrode and the first transparent conductive layer use a same material and are formed in a same photolithography process; the pixel electrode and the second transparent conductive layer adopt a same material and are formed in the same photolithography process.

In a fourth aspect of the invention, there is provided a manufacturing method of an array substrate, comprising the following steps: forming a pattern of a gate electrode, a pattern of a gate line, and a pattern of a gate line PAD area on a substrate; forming a gate insulating layer and an active layer in sequence; forming a second transparent conductive layer, a source electrode and a drain electrode that are separated from each other, a data line and a data line PAD area in sequence; forming a passivation layer so as to expose the gate line PAD area and the data line PAD area.

In the manufacturing method of the array substrate, for example, the array substrate is of an ADS mode, and the forming of the pattern of the gate electrode, the pattern of the gate line, and the pattern of the gate line PAD area on the substrate comprises:

forming a first conductive layer and a gate metal layer sequentially on the substrate;

forming a photoresist pattern with different heights on the gate metal layer;

conducting steps of exposure-and-development on the photoresist pattern, and etching the gate metal layer respectively after each exposure-and-development, so as to form the pattern of the gate electrode, the pattern of the gate line, the pattern of the Gate line PAD area and a pattern of a common electrode.

In the manufacturing method of the array substrate, for example, the array substrate is of a TN mode, and the forming of the pattern of the gate electrode, the pattern of the gate line, and the pattern of the gate line PAD area on the substrate comprises:

forming a first conductive layer and a gate metal layer sequentially on the substrate;

spin-coating photoresist on the gate metal layer, conducting exposure-and-development with a mask plate, so that the photoresist in correspondence with pattern of the gate electrode, pattern of the gate line, and a pattern of the gate line PAD area is retained;

forming the pattern of the gate electrode, the pattern of the gate line, and the pattern of the gate line PAD area through etching.

In the manufacturing method of the array substrate, for example, when the active layer is of an oxide semiconductor material, forming of the gate insulating layer and the active layer in sequence further comprises performing patterning of a protective layer, the step comprising:

depositing the gate insulating layer, an oxide semiconductor layer and the protective layer sequentially;

spin-coating photoresist on the protective layer;

conducting exposure-and-development with a half-tone or grey-tone mask plate, so that the photoresist in a region for the pattern of the protective layer is fully retained, and the photoresist in two contact areas for connection to the source electrode and the drain electrode are partially retained;

forming the pattern of the oxide semiconductor layer and the pattern of the protective layer through a multi-step etching process.

In the manufacturing method of the array substrate, for example, when the active layer is of an amorphous silicon material, the forming of the gate insulating layer and the active layer in sequence comprises:

depositing the gate insulating layer and the active layer that comprises an intrinsic layer and an N-type layer sequentially;

spin-coating photoresist on the N-type layer;

conducting exposure-and-development so that the photoresist in a region for the pattern of the active layer is retained;

etching off the intrinsic layer and the N-type layer in a region where no photoresist is retained.

In the manufacturing method of the array substrate, for example, forming of the second transparent conductive layer, the source electrode and the drain electrode that are separated from each other, the data line and the data line PAD area in sequence comprises:

performing patterning on the second transparent conductive layer and an electrode metal layer:

depositing the second transparent conductive layer and the electrode metal layer sequentially;

spin-coating photoresist on the electrode metal layer;

conducting exposure-and-development with a half-tone or grey-tone mask plate, so that the photoresist for the source electrode, the drain electrode and the data line, and the data line PAD area is fully retained, and the photoresist in a pixel electrode area is partially retained;

forming the source electrode, the drain electrode and the data line and the data line PAD area through a multi-step etching.

In the manufacturing method of the array substrate, for example, when the active layer is of an amorphous silicon material, the method further comprising: etching off the N-type layer in a channel region.

In a fifth aspect of the invention, there is provided a display device, comprising the any above-mentioned array substrate or the thin film transistor manufactured by any of the above manufacturing methods With respect to the thin film transistor in embodiments of the invention, transparent conductive layers are added between the substrate and the gate metal layer and between the active layer and the electrode metal layer, so that adhesive force between the gate metal layer and the substrate is enhanced, diffusion of the electrode metal to the active layer is prevented, and performance of the product is improved. The manufacturing methods of the array substrate according to embodiments of the invention are simple, so that the array substrate and the display device based on the array substrate each have low costs and high cost performance.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

REFERENCE NUMERALS

Figure 1A:
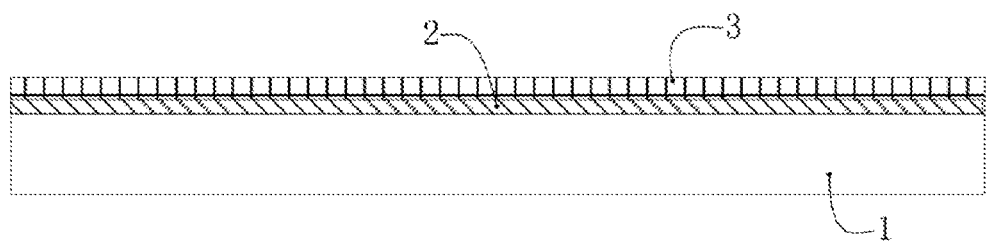
FIG. 1a to FIG. 1f are schematic views showing processes of forming a transparent conductive layer, a pattern of a gate electrode, a pattern of a gate line, and a pattern of a gate-line PAD area on a substrate in embodiment 1 according to the invention, respectively.

1: a substrate; 2: a first transparent conductive layer; 2a: an adhesion enhancing layer; 2b: a common electrode; 3: a gate electrode/a gate thin film; 4: a gate insulating layer; 5: an active layer; 6: a protective layer; 7: a second transparent conductive layer; 7a: a diffusion blocking layer; 7b: a pixel electrode; 8: an electrode metal layer; 8a: a source electrode; 8b: a drain electrode; 9: a passivation layer; 10: an intrinsic layer; 11: a N-type layer; 15: a photoresist; 110: a gate line PAD; 120: a data line PAD.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

Unless otherwise defined, the technical or scientific terminology used herein should have the same meaning as commonly understood by one of ordinary skill in the art to which this invention belongs. "First", "second" and the like used in specification and claims of the patent application of the invention do not show any order, number or importance, but are only used to distinguish different constituent parts. Likewise, a term such as "a," "an," "the" or the like does not indicate limitation in number, but specifies the presence of at least one. A term such as "comprise," "comprising," "comprise," "comprising", "contains" or the like means that an element or article ahead of this term encompasses element(s) or article(s) listed behind this term and its (their) equivalents, but does not preclude the presence of other elements or articles. A term such as "connection," "connected," or the like is not limited to physical or mechanical connection, but can comprise electrical connection, whether directly or indirectly. "Upper," "lower," "left," "right" or the like is only used to describe a relative positional relationship, and when an absolute position of the described object is changed, the relative positional relationship might also be changed accordingly.

An array substrate according to an embodiment of the invention may comprise a plurality of gate lines and a plurality of data lines, and these gate lines and data lines cross over each other to thereby define a plurality of pixel units arranged in a matrix form. Each of the pixel units comprises, for example, a thin film transistor functioning as a switch element and a pixel electrode for controlling alignment of liquid crystals. For example, for the thin film transistor of each of the pixel units, its gate electrode is electrically connected to or integrally formed with a corresponding gate line, its source electrode is electrically connected to or integrally formed with a corresponding data line, and its drain electrode is electrically connected to or integrally formed with a corresponding pixel electrode. Descriptions and drawings given below are chiefly concerned with a single pixel unit or a plurality of pixel units, but other pixel unit(s) can be formed in the same way.

Embodiment 1

The embodiment is an application in a LCD of an ADS mode, and the adopted active layer is formed of an oxide semiconductor material. The ADS mode is an example of a horizontal electric field type.

Figure 4:
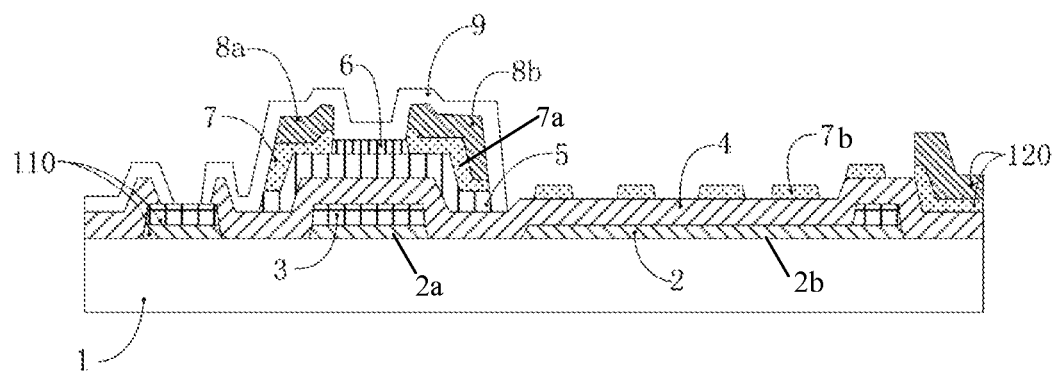
FIG. 4 is a cross-sectional view showing an array substrate in embodiment 1 of the invention.

FIG. 4 is a cross-sectional view showing one pixel unit which comprises a thin film transistor in an array substrate according to the embodiment, and a gate electrode 3, a source electrode 8a and a drain electrode 8b in the thin film transistor of the embodiment each are of copper material. Certainly, if desired, these electrodes can also adopt an elementary substance of metal such as molybdenum, aluminum, neodymium, copper, titanium, or the like, an alloy of each elementary substance of metal, or other material. Between the source electrode 8a and an active layer 5 and between the drain electrode 8b and the active layer 5, there is a second transparent conductive layer 7. The second transparent conductive layer 7 is located between electrodes 8a, 8b of copper metal and the active layer 5, which can prevent diffusion of the electrode metal toward the active layer 5 that is incurred by the reaction between the electrodes of copper metal and the active layer 5. A gate-line PAD 110 and a data-line PAD 120 exemplarily show peripheral circuit portions of the array substrate, and are adapted for connection to external circuits, for example, for input of gate driving signals and data signals.

Preferably, between the gate electrode 3 and a substrate 1, there may be further provided a first transparent conductive layer 2; and the first transparent conductive layer 2 can increase the adhesive force between the substrate 1 and copper metal for the gate electrode 3, so as to enhance stability of products.

The first transparent conductive layer 2 shown in FIG. 4 can further be divided into two parts in terms of its functions, which comprise an adhesion enhancing layer 2a between the gate electrode 3 and the substrate 1 and a common electrode 2b between a gate insulating layer 4 and the substrate 1, respectively, as shown in the figure. In the course of forming the first transparent conductive layer 2, the adhesion enhancing layer 2a and the common electrode 2b can be formed simultaneously. With the adhesion enhancing layer 2a, the adhesive force between the substrate 1 and copper metal for the gate electrode 3 is increased, so as to enhance stability of products. While the adhesion enhancing layer 2a is formed, the common electrode 2b is formed as well, so that a manufacturing step of forming a common electrode separately can be reduced. Not only quality of the thin film transistor can be raised, but also its manufacturing process is simplified.

The second transparent conductive layer 7 shown in FIG. 4 can further be divided into two parts in terms of its function, which comprise a diffusion blocking layer 7a between the source electrode 8a and the active layer 5 and between the drain electrode 8b and the active layer 5, and a pixel electrode 7b of a pixel region located on the gate insulating layer, respectively, as shown in the figure. In the course of forming the second transparent conductive layer 7, the diffusion blocking layer 7a and the pixel electrode 7b can be formed simultaneously, which not only can raise quality of the thin film transistor, but also simplifies its manufacturing process.

The first transparent conductive layer 2 and the second transparent conductive layer 7 may adopt the following transparent conductive materials separately or together: zinc oxide, indium tin oxide, indium zinc oxide, indium zinc tin oxide, polymer ethylenedioxy thiophene, grapheme, or the like. One preferable example is ITO, etc.

An embodiment, in which an array substrate containing the above thin film transistor is manufactured, comprises the following steps.

First Step

At first, as shown in FIG. 1a, a first transparent conductive layer 2 is formed on a substrate 1, and then a copper metal gate thin film 3 is formed on the first transparent conductive layer 2. If desired, the substrate 1 can be selected from substrates of different substances, such as a glass substrate or a quartz substrate. The formation method of the gate thin film 3 may be, for example, plasma enhanced chemical vapor deposition (PECVD), magnetron sputtering, thermal evaporation or other film forming method. Further, a deposition method, a spin-coating method or a roller-coating method may be used for formation of the first transparent conductive layer 2.

Secondly, a layer of photoresist 15 is spin-coated on the gate thin film 3. A spin-coating method or a roller-coating method may be used for the formation of the photoresist 15.

Figure 1B:
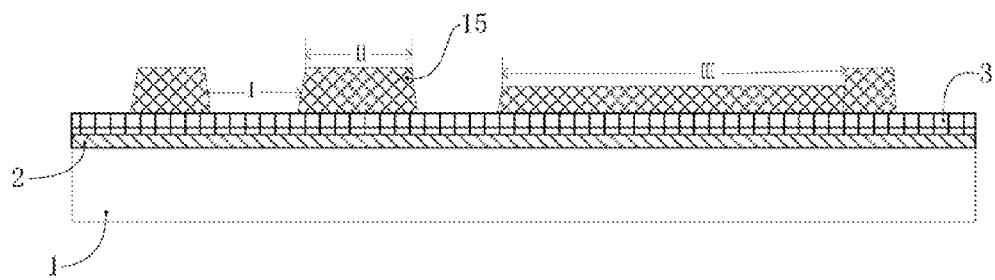

Next, a photoresist pattern with different heights is formed on the gate layer. To achieve this, for example, it is possible that exposure is conducted with different amounts of exposure according to different locations of the photoresist layer, and then development is carried out, so as to remove different amounts of photoresist from the different locations of the photoresist layer. In this regard, for example, a double-tone mask plate (such as a half-tone or a grey-tone mask plate) can be used for exposure-and-development. As shown in FIG. 1b, after exposure-and-development, the photoresist 15 is divided into a fully-removed area I, a fully-retained area II and a partially-retained area III. The fully-retained area II of the photoresist corresponds to a region where patterns of a gate electrode, a gate line and a gate-line PAD 110 area are to be formed, the partially-retained area III of the photoresist corresponds to a region where the pattern of a common electrode is to be formed, and the fully-removed area I of the photoresist corresponds to a region other than the fully-retained area II of the photoresist and the partially-retained area III of the photoresist. The gate-line PAD area and the data-line PAD area refer to peripheral circuit parts of the array substrate, and are adapted for connection to external circuit boards, so as to input a gate driving signal and a data signal.

Then, a multi-step etching process is conducted, so as to obtain desired patterns. For example, the multi-step etching process comprises: a first etching process→an ashing process→a second etching process.

Figure 1C:
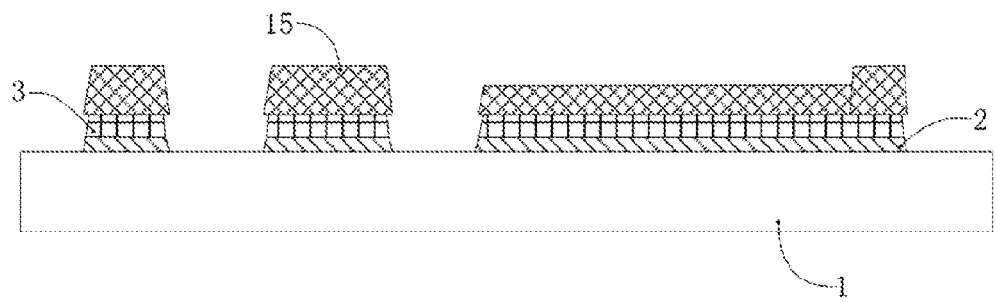
Figure 1D:
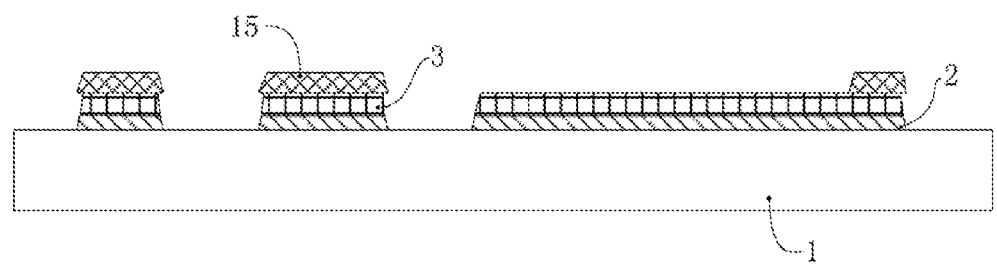
Figure 1E:
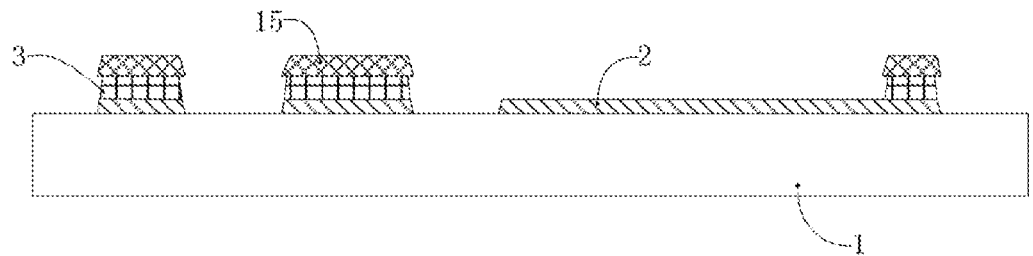
Figure 1F:
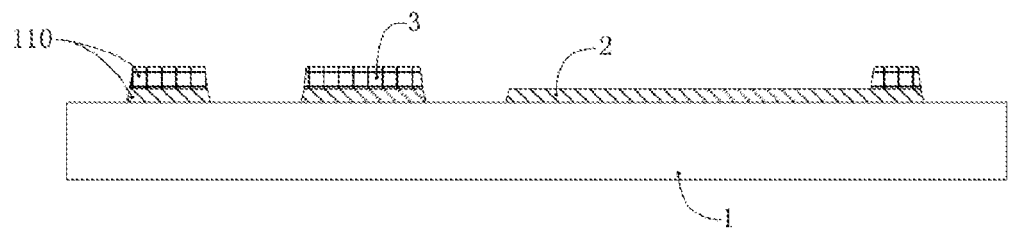

As shown in FIG. 1c, through the first etching process, the first transparent conductive layer 2 and the copper gate thin film 3 in the fully-removed area I of the photoresist are etched away; next, as shown in FIG. 1d, an ashing process is performed on the photoresist 15 on the array substrate shown in FIG. 1c, so that the photoresist 15 in the partially-retained area III is removed, and the fully-retained area of the photoresist is partially thinned as well; and then, the second etching process is conducted on the array substrate shown in FIG. 1d, so that the copper gate thin film 3 in the partially-retained area III of the photoresist is etched away, a pattern of the common electrode is obtained, and a cross-sectional view of the array substrate after completion being shown in FIG. 1e. As shown in FIG. 1f, after completion of the etching process, the photoresist 15 is removed by a way of stripping. To remove the photoresist 15, a direct stripping process can be employed, or an ionic liquid stripping is conducted by using PGMEA or EGMEA as a solvent.

As can be understood from above, if the first transparent conductive layer 2 between the gate electrode 3 and the substrate 1 is not added in the step, then the partially-retained area III in FIG. 1b can be changed to be a fully-retained area II, so that the common electrode is produced in the same layer as the gate electrode.

If the first transparent conductive layer 2 is further formed between the gate electrode 3 and the substrate 1, then the first transparent conductive layer 2 can increase the adhesive force between the substrate 1 and the copper metal for the gate electrode 3, so that stability of the product can be enhanced. Furthermore, in the course of forming the first transparent conductive layer 2, if an adhesion enhancing layer 2a and a common electrode 2b are further formed simultaneously, then not only quality of the thin film transistor can be improved, but also its manufacturing process is simplified.

Second Step

The following processes are performed on the substrate subjected to the above first step in sequence.

Firstly, a gate insulating layer 4, an active layer 5 and a protective layer 6 are sequentially deposited;

secondly, a layer of photoresist 15 is spin-coated on the protective layer 6;

next, exposure-and-development is conducted with a double-tone mask plate (such as a half-tone or grey-tone mask plate).

Figure 2A:
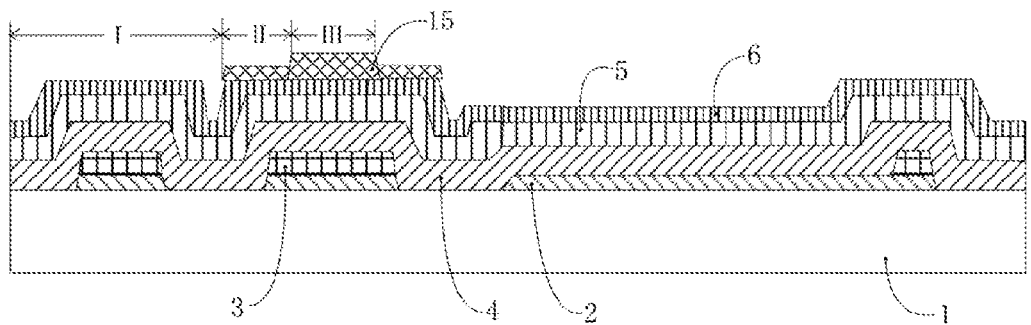
FIG. 2a to FIG. 2e are schematic views showing processes of forming a gate insulating layer, an active layer and a protective layer on the substrate subsequent to FIG. 1f in embodiment 1 according to the invention, respectively.

As shown in FIG. 2a, similarly, after exposure-and-development, the photoresist 15 is divided into a fully-removed area I, a partially-retained area II and a fully-retained area III. Here, the fully-retained area III of the photoresist corresponds to a region where a protective layer is to be formed, which serves to protect an oxide semiconductor, so as not to bring about damage to the oxide semiconductor during etching, and the partially-retained area II of the photoresist serves to form contact areas with a source electrode and a drain electrode. Of course, when the protective layer 6 is not needed, it can be removed after an exposure-and-development procedure of the photoresist.

Then, a multi-step etching process is conducted, so as to obtain desired patterns. The multi-step etching process comprises: a first etching process→an ashing process→a second etching process.

Figure 2B:
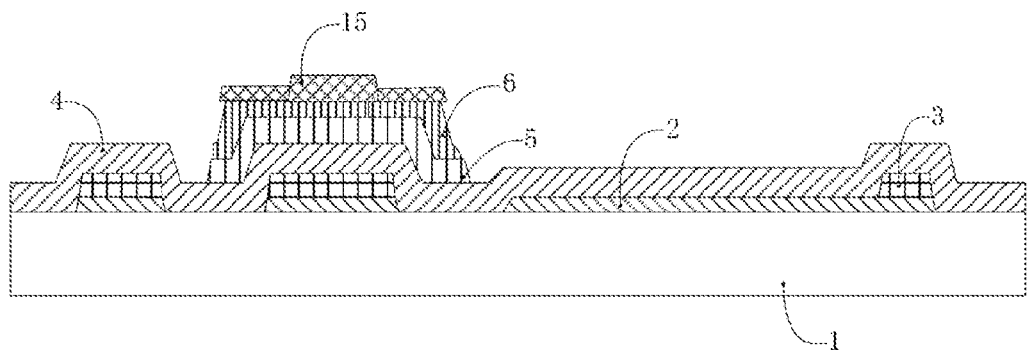
Figure 2C:
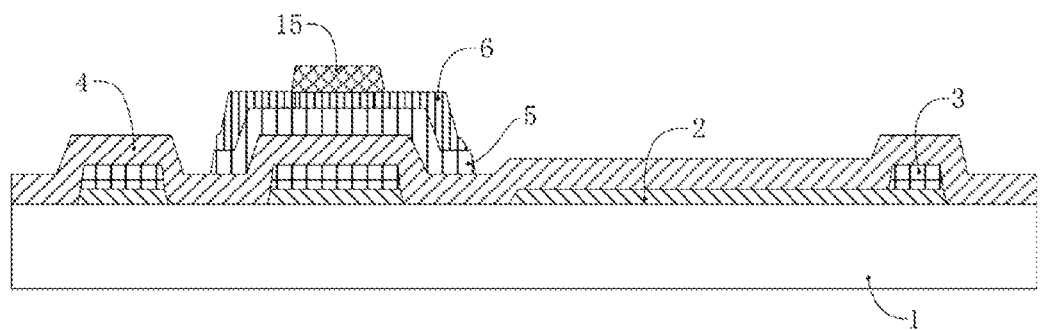
Figure 2D:
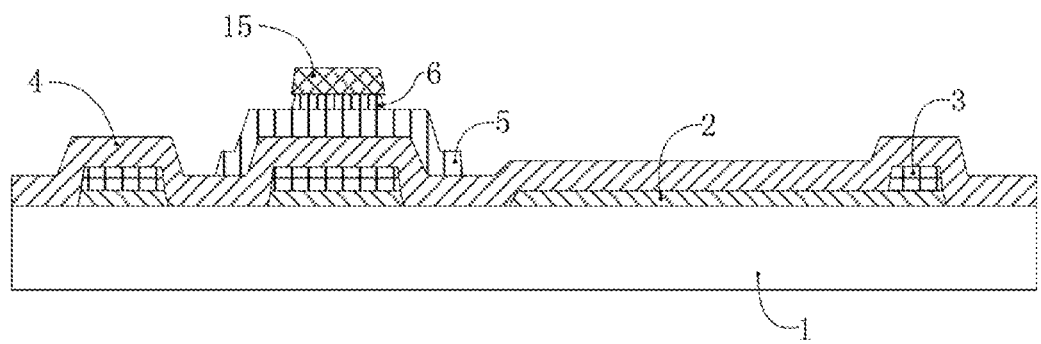
Figure 2E:
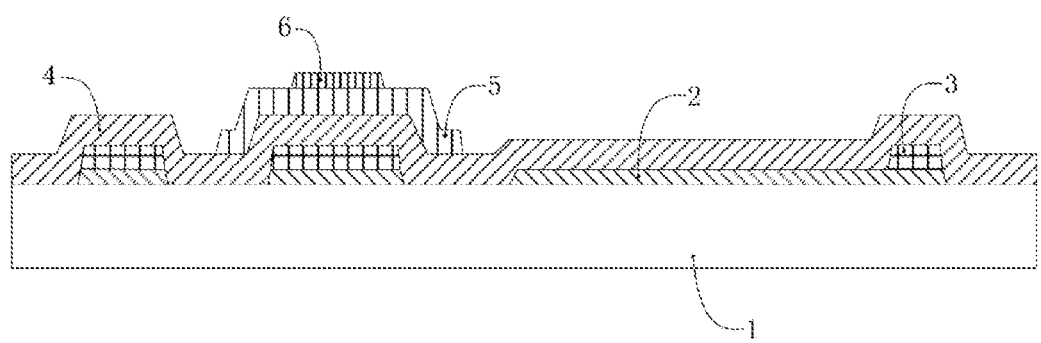

As shown in FIG. 2b, the first etching process is conducted with the use of the above photoresist layer, so as to etch away the active layer 5 and the protective layer 6 in fully-removed area I of the photoresist. Next, as shown in FIG. 2c, an ashing process is performed on the photoresist 15 on the array substrate shown in FIG. 2b, so that the photoresist 15 in the partially-retained area II is removed, and meanwhile the photoresist in the fully-retained area of the photoresist is partially thinned as well; and then, the second etching process is conducted on the array substrate shown in FIG. 2c to etch away the protective layer 6 in the partially-retained area II of the photoresist, so as to expose the oxide semiconductor, a cross-sectional view of the array substrate after completion being shown in FIG. 2d. As shown in FIG. 2e, after completion of the etching process, the photoresist 15 is removed by stripping, and the removing method may be the same as that in the above first step.

Third Step

The following processes are performed on the substrate subjected to the above second step in sequence.

Firstly, a second transparent conductive layer 7 and an electrode metal layer 8 are sequentially formed on the substrate 1;

secondly, a layer of photoresist 15 is spin-coated on the electrode metal layer 8;

next, exposure-and-development is conducted with a double-tone mask plate (such as a half-tone or grey-tone mask plate).

Figure 3A:
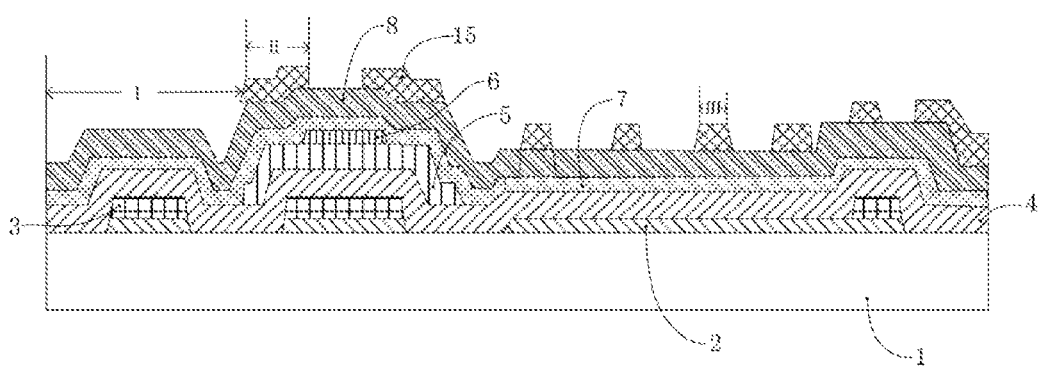
FIG. 3a to FIG. 3e are schematic views showing processes of forming a second transparent conductive layer, an electrode metal layer, a passivation layer and a pattern of a data PAD area on the substrate subsequent to FIG. 2e in embodiment 1 according to the invention, respectively.

As shown in FIG. 3a, similarly, after exposure-and-development, the photoresist 15 is divided into a fully-removed area I, a fully-retained area II and a partially-retained area III. Here, the fully-retained area II of the photoresist corresponds to a region where a pattern comprising a source electrode 8a, a drain electrode 8b, a data line and a data-line PAD 120 is to be formed, the partially-retained area III of the photoresist corresponds to a region where pattern of a pixel electrode is to be formed, and the fully-removed area I of the photoresist corresponds to a region other than the fully-retained area II and the partially-retained area III of the photoresist.

Then, a multi-step etching process is conducted, so as to obtain desired patterns. The process of the multi-step etching process comprises: a first etching process→an ashing process→a second etching process.

Figure 3B:
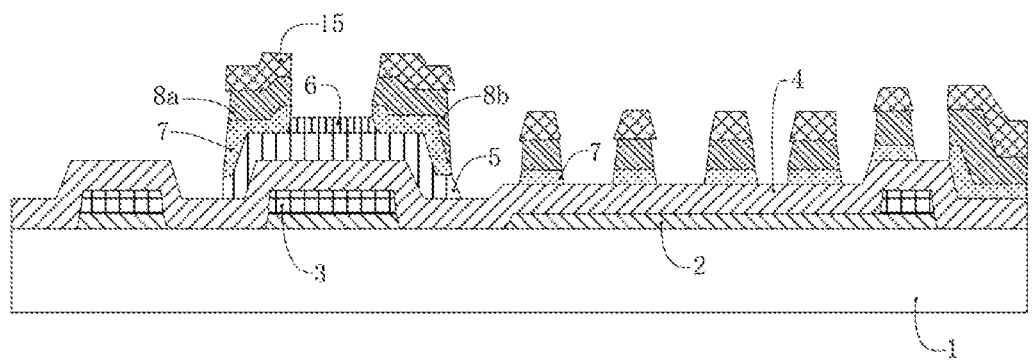
Figure 3C:
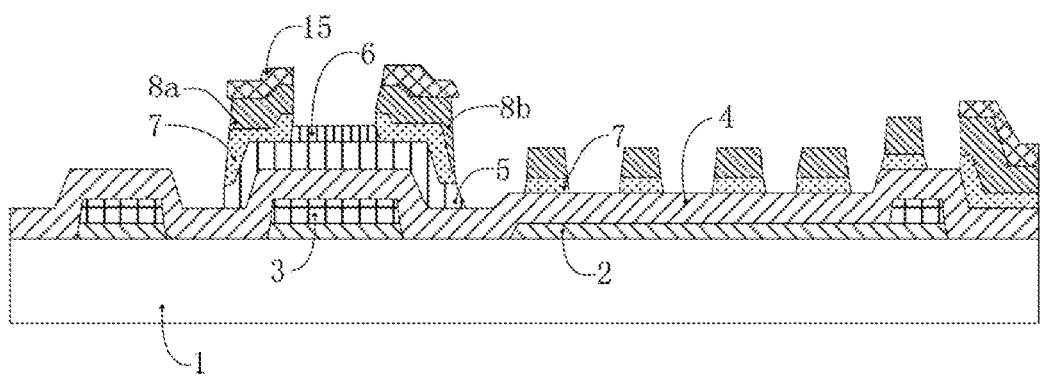
Figure 3D:
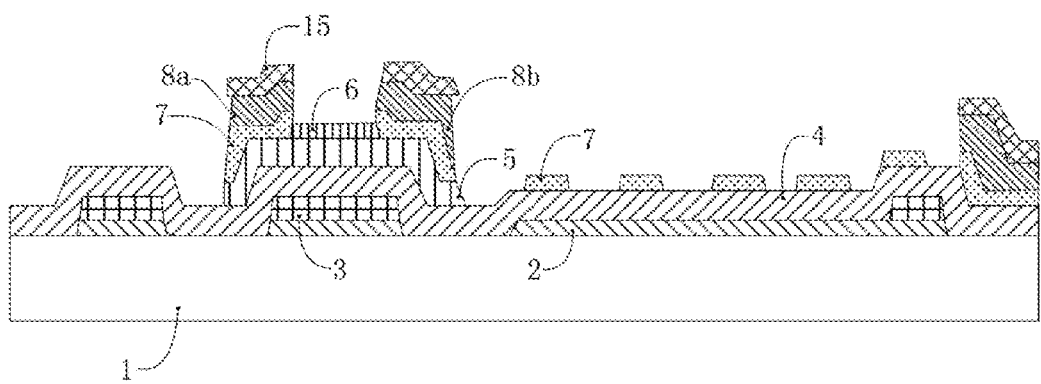
Figure 3E:
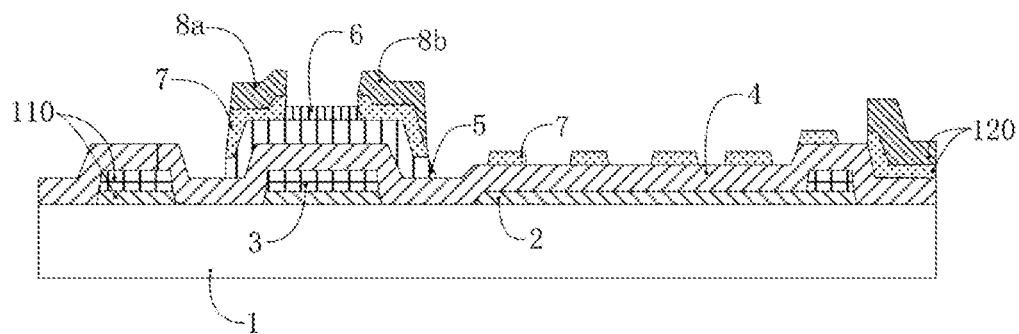

As shown in FIG. 3b, the first etching process is conducted with the use of the above photoresist layer, so that the second transparent conductive layer 7 and the electrode metal layer 8 in the fully-removed area I of the photoresist are etched away. Next, as shown in FIG. 3c, an ashing process is performed on the photoresist 15 on the array substrate shown in FIG. 3b, so that the photoresist 15 in the partially-retained area III is removed, and the photoresist in the fully-retained area of the photoresist is partially thinned as well; and then, the second etching process is conducted on the array substrate shown in FIG. 3c to etch away the electrode metal layer 8 in the partially-retained area III of the photoresist, so as to expose the second transparent conductive layer 7, a cross-sectional view of the array substrate after completion being shown in FIG. 3d. As shown in FIG. 3e, after completion of the etching process, the photoresist 15 is removed by stripping, and the removing method may be the same as that in the above first step.

Fourth Step

At last, a passivation layer 9 is deposited on the array substrate subjected to the above third step. As shown in FIG. 4, the gate-line PAD area and the data-line PAD area are exposed through exposure and etching.

After the photoresist 15 is stripped off, the manufacture of the thin film transistor array substrate according to the embodiment of the invention is completed.

On the array substrate of the ADS mode according to the embodiment, the pixel electrode is electrically connected to a source electrode or a drain electrode of the thin film transistor, and the pixel electrode and the common electrode are disposed in different layers of the array substrate; between the pixel electrode and the common electrode, there is provided an insulating layer. The common electrode roughly covers the whole pixel area, and the shape of the pixel electrode is in a slit configuration.

As can be seen from above, the manufacturing process of the thin film transistor array substrate according to the embodiment can be implemented with four patterning processes. Namely, the manufacture of the thin film transistor array substrate can be completed without increasing the number of patterning process, as compared to prior processes.

Embodiment 2

Another embodiment of the invention is applied to a LCD of a TN mode. The TN mode is an example of a vertical electrode field type.

Figure 5:
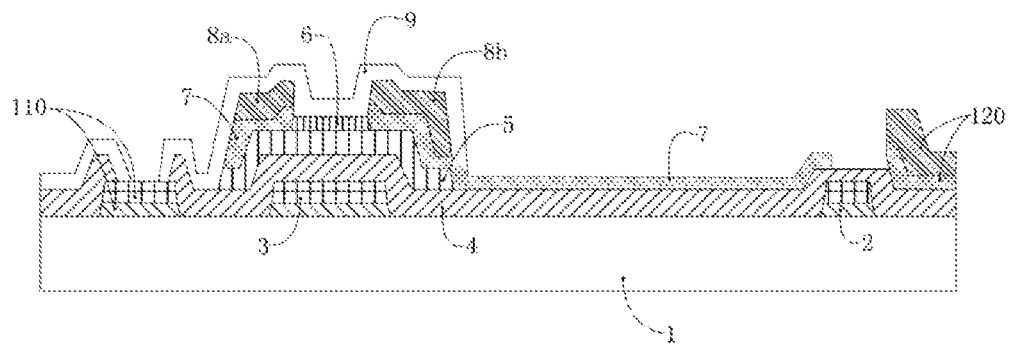
FIG. 5 is a cross-sectional view showing an array substrate in embodiment 2 of the invention.

FIG. 5 is a cross-sectional view showing one pixel unit, which comprises a thin film transistor, in an array substrate according to the embodiment, and the difference between this embodiment and the LCD in the ADS mode in Embodiment 1 will be explained below. In the LCD in the ADS mode, the pixel electrode formed by the second transparent conductive layer 7 has a slit configuration, while in the LCD in the TN mode, a pixel electrode formed by a second transparent conductive layer 7 has a plate shape or a sheet shape. So, upon a first patterning process during manufacture, a multi-step etching process in which a half-tone or gray-tone mask plate is used for exposure-and-development is not needed any more.

The difference of manufacturing method between the array substrate according to this embodiment and the array substrate according to Embodiment 1 will be explained below. The manufacturing method of the array substrate according to this embodiment comprises the following steps.

Firstly, after a first transparent conductive layer 2 and a gate metal layer are formed, exposure-and-development is conducted with a mask plate for a gate pattern, so as to retain the photoresist 15 for patterns of a gate electrode, a gate line and a gate-line PAD 110 area; and secondly, the above stacked layers on the substrate 1 is etched, so as to fully etch away the first transparent conductive layer and the gate metal layer in a region other than the patterns of the gate electrode, the gate line and the gate-line PAD 110 area.

Subsequently, it is to perform the same steps as Embodiment 1 so as to form a gate insulating layer 4, an active layer 6, a protective layer 6, the second transparent conductive layer 7, a source electrode 8a, a drain electrode 8b and a passivation layer 9; when the pixel electrode is formed with the second transparent conductive layer 7, it is to assure a sheet-shaped structure of the pixel electrode.

As can be seen from the above, in the two embodiments, the transparent conductive layer is inserted between the active layer and the electrode metal layer in the thin film transistors, and this transparent conductive layer can prevent diffusion of the electrode metal toward the active layer, thereby improving performance of the products.

Figure 9:
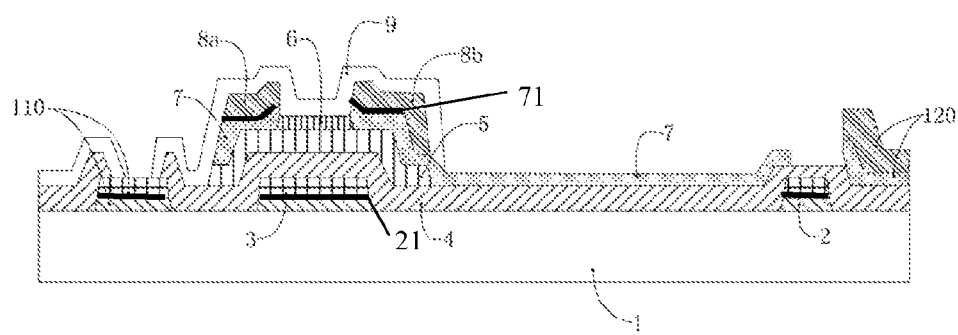
FIG. 9 is a cross-sectional view showing an array substrate in another embodiment of the invention.

When the metal electrode is formed of a copper material, the copper material has stronger diffusion to the active layer. In one example, in order to further prevent diffusion of copper to the active layer and increase the adhesive force of copper, a metal layer may be further added between the gate electrode and the first transparent conductive layer and/or between the electrode metal layer and the second transparent conductive layer. The material for the metal layer may be an elementary substance such as molybdenum, aluminum, neodymium, titanium, or the like, an alloy corresponding to each elementary substance, or other material. As shown in FIG. 9, a modification of the embodiment shown in FIG. 5, a metal layer 21 is further added between the gate electrode 3 and the first transparent conductive layer 3, and a metal layer 71 is further added between the electrode metal layer 8 and the second transparent conductive layer 7.

Embodiment 3

Figure 6:
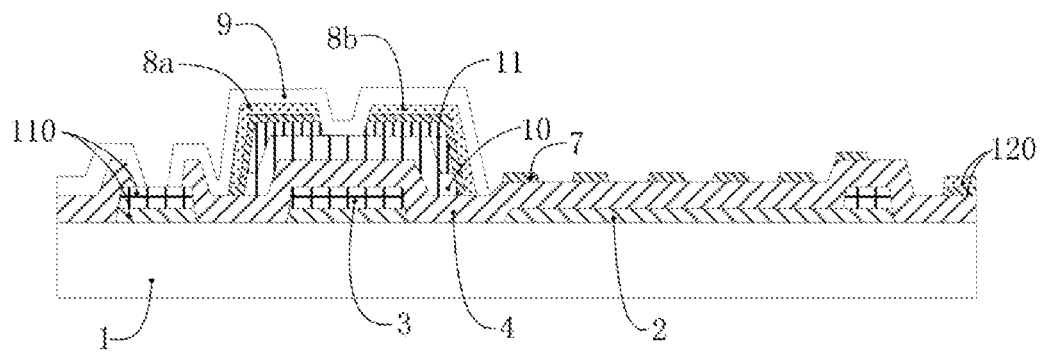
FIG. 6 is a cross-sectional view showing an array substrate in embodiment 3 of the invention.

An active layer in another embodiment of the invention is of an amorphous silicon material, and the embodiment is applicable for an ADS mode LCD, a TN mode LCD, etc. FIG. 6 is a cross-sectional view showing a thin film transistor according to the embodiment. The active layer comprises a lower intrinsic layer 10 and an upper N-type layer 11. In the embodiment, the intrinsic layer 10 is of a-Si, and the N-type layer 11 is of N+ a-Si, which is formed by doping N-type dopant atoms into a-Si.

The structure of the thin film transistor according to the embodiment is similar to the structure of the thin film transistor in Embodiment 1, and differences lie in that the active layer in the embodiment has a double-layered structure, and there is no protective-layer structure of the thin film transistor in Embodiment 1.

In manufacture of an array substrate containing the thin film transistor according to the embodiment, the step of forming a pattern of a gate electrode, a pattern of a gate line, pattern of a gate-line PAD area and a pattern of a first transparent conductive layer on a substrate 1 is the same as that in Embodiment 1. After the structure of the gate metal layer and the first transparent conductive layer is formed on the substrate, the following steps are performed.

Figure 7A:
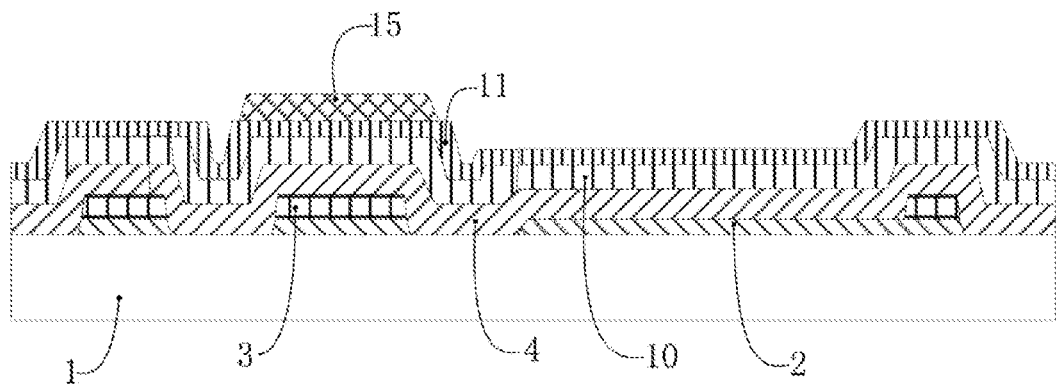
FIG. 7a to FIG. 7d are schematic views showing the manufacturing process of the array substrate in embodiment 3 of the invention, respectively.

Firstly, a gate insulating layer 4, an intrinsic layer 10 of a-Si material, and an N-type layer 11 of N+ a-Si material are deposited on the substrate 1 in sequence;

secondly, photoresist 15 is spin-coated on the N-type layer;

Next, exposure-and-development is conducted on the photoresist 15 so as to retain the photoresist 15 in the region for pattern of an active layer, and a cross-sectional view of the array substrate after completion is shown in FIG. 7a.

Then, the intrinsic layer 10 and the N-type layer 11 in the region where no photoresist is retained are etched away.

Figure 7B:
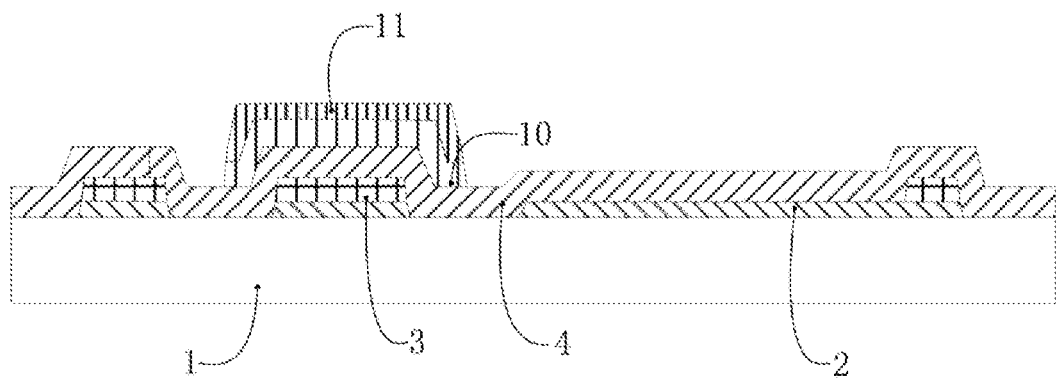

A cross-sectional view of the array substrate, which is subjected to the above steps and from which the photoresist 15 has been removed, is shown in FIG. 7b.

Figure 7C:
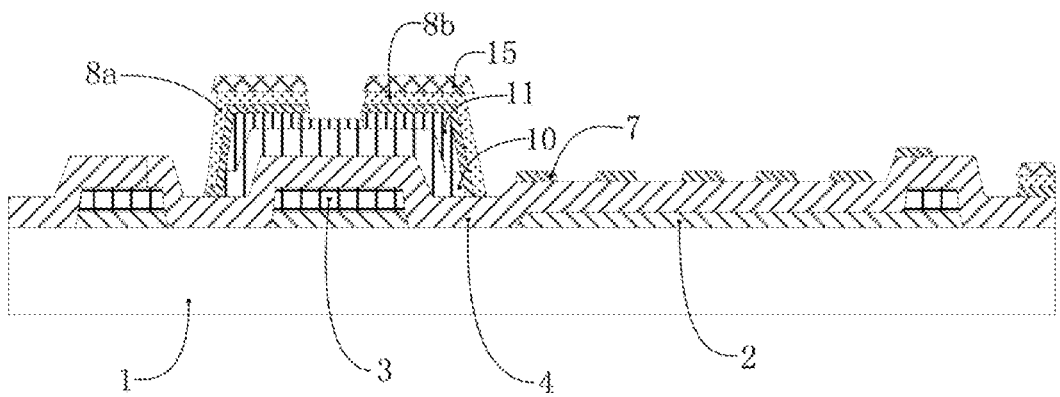

Afterwards, a step in Embodiment 1 is performed on the array substrate obtained after the above steps so as to form patterns of a source electrode, a drain electrode, a data line and a data-line PAD area. A cross-sectional view of the array substrate at this point is shown in FIG. 7c.

Figure 7D:
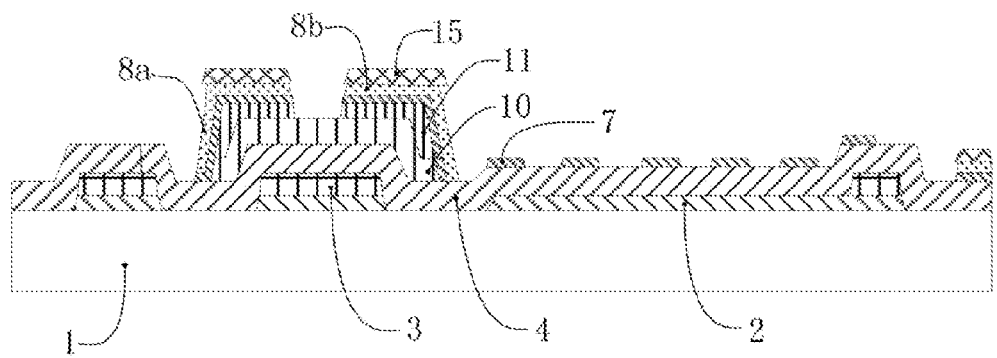

The embodiment differs from Embodiment 1 in that the active layer for the thin film transistor has a double-layered structure, and that there is no protective layer. Therefore, the manufacturing process of the array substrate according to the embodiment further comprises the following step: the N-type layer in a channel region is etched away. A cross-sectional view of the array substrate obtained after the N-type layer in the channel region is etched away is shown in FIG. 7d.

After the above steps are completed and the photoresist 15 is removed, a passivation layer 9 is deposited on the array substrate, and a gate-line PAD area and a data-line PAD area are exposed through exposure-and-development, thereby completing manufacture of the thin film transistor array substrate according to the embodiment.

A transparent conductive layer is added between the active layer and the electrode metal layer in the thin film transistor according to the embodiment, and thereby diffusion of the electrode metal to the active layer can be prevented, and performance of the product is improved. When the metal electrode makes use of a copper material, the copper material has stronger diffusion to the active layer. In one example, in order to further prevent diffusion of copper to the active layer and increase the adhesive force of copper, a metal layer may be further added between the gate electrode and the first transparent conductive layer and/or between an electrode metal layer and a second transparent conductive layer. The material for the metal layer may be an elementary substance such as molybdenum, aluminum, neodymium, titanium, or the like, an alloy corresponding to each elementary substance, or other material. In the array substrate with the above structure, the pattern of the metal layer is the same as the pattern of a gate layer, and the electrode metal layer, and its manufacturing method is substantially the same as any one of the above embodiments. When the gate layer and the electrode metal layer are patterned, patterning of the metal layer is completed together.

Certainly, the thin film transistor array substrate according to the embodiment may also be completed by other manufacturing method. As compared to prior method, the first transparent conductive layer 2 and the second transparent conductive layer 7 are added in the embodiment in term of structure, and the two layers can be formed through separate patterning processes. Although the number of the patterning processes is increased by the separate patterning processes and the production costs are increased, the manufacture of the thin film transistor array substrate according to the embodiment can still be completed.

Embodiment 4

The embodiment provides a manufacturing method of a thin film transistor, comprising:

forming a gate electrode on a substrate;

forming a gate insulating layer and an active layer on the gate electrode;

forming a second transparent conductive layer on the gate insulating layer and the active layer and an electrode metal layer located on the second transparent conductive layer; and forming a passivation layer on the electrode metal layer and the second transparent conductive layer.

For example, the step of forming the gate electrode on the substrate may comprise: firstly forming a first transparent conductive layer on the substrate to function as an adhesion enhancing layer between the gate electrode and the substrate. The gate electrode and the adhesion enhancing layer can be formed in a same step. Furthermore, in the course of forming the first transparent conductive layer, the adhesion enhancing layer and a common electrode for an array substrate can also be formed simultaneously, which not only can raise quality of the thin film transistor, but also simplifies the manufacturing process for producing the array substrate.

For example, a first conductive layer and a gate metal layer are sequentially formed on the substrate; photoresist is formed on the gate metal layer; exposure-and-development is conducted on the photoresist, and after each exposure-and-development, the gate metal layer is etched correspondingly so as to form a corresponding pattern. It should be noted that, when the common electrode for the array substrate is formed along with the first transparent conductive layer, it is necessary to form a photoresist pattern with different heights on the gate metal layer, and to conduct corresponding multi-step of exposure-and-development of photoresist.

For example, the step of forming the gate insulating layer and the active layer on the gate electrode comprises the following steps. The gate insulating layer and the active layer are sequentially formed on the formed gate electrode, photoresist is formed on the active layer; exposure-and-development is conducted on the photoresist, and etching is conducted after each exposure-and-development, so that a corresponding pattern is formed.

For example, when the active layer is of an oxide semiconductor, a gate insulating layer, the active layer and a protective layer are sequentially deposited on the formed gate electrode, and photoresist is formed on the protective layer.

For example, the gate insulating layer, the oxide semiconductor layer and the protective layer are sequentially deposited on the gate electrode; the photoresist is spin-coated on the protective layer; exposure-and-development is conducted with a half-tone or grey-tone mask plate for example, so that the photoresist in a region for the pattern of the protective layer is fully retained, and the photoresist in two contact areas for connection to a source electrode and a drain electrode are partially retained; after a multi-step etching process, the pattern of the oxide semiconductor layer and a pattern of the protective layer are formed.

For example, when the active layer is of an amorphous silicon material, the active layer comprises an intrinsic layer and an N-type layer.

For example, the gate insulating layer, the intrinsic layer and the N-type layer are sequentially deposited; photoresist is spin-coated on the N-type layer; exposure-and-development is conducted, so that the photoresist in a region for the pattern of the active layer is retained; the intrinsic layer and the N-type layer in the region where no photoresist is retained are etched away.

In the step of forming the second transparent conductive layer on the gate insulating layer and the active layer and the metal layer located on the second transparent conductive layer, the metal layer comprises a source electrode and a drain electrode separated from each other with a channel region between the electrodes. The step comprises the following: the second transparent conductive layer and the electrode metal layer are sequentially formed on the gate insulating layer and the active layer; photoresist is formed on the electrode meal layer; exposure-and-development is conducted on the photoresist, and etching is conducted after each exposure-and-development, so as to form a corresponding pattern.

For example, with the second transparent conductive layer, a pixel electrode necessary for an array substrate can further be formed in the process step, and the pixel electrode can be made in a slit configuration, a plate shape, or the like according to requirements.

For example, on the gate insulating layer and the active layer, the second transparent conductive layer and the electrode metal layer are sequentially deposited; photoresist is spin-coated on the electrode metal layer; exposure-and-development is conducted with a half-tone or grey-tone mask plate, and an etching process is conducted after the exposure-and-development to form a source electrode and a drain electrode.

For example, when the active layer is of an amorphous silicon material, the following step is further comprised: the N-type layer in a channel region is etched away.

In the above embodiments, the fully-retained area of photoresist does not mean that the photoresist in this area does not have any change but means that it is basically preserved and has a thickness larger than the thickness in the partially-retained area of photoresist.

Embodiment 5

According to an embodiment of the invention, there is further provided a display device, comprising the array substrate according to any of above embodiments.

Figure 8:
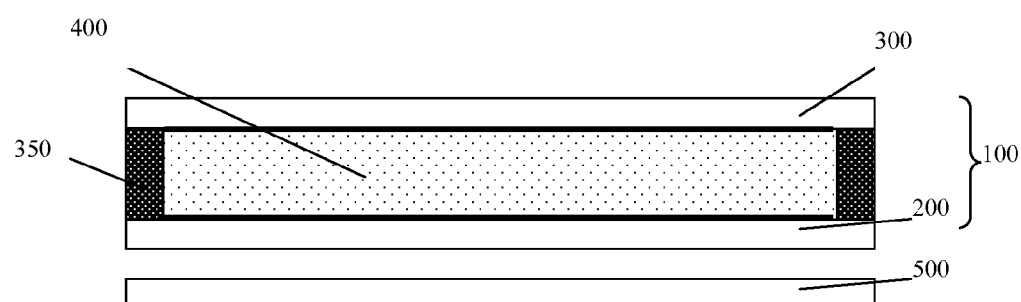
FIG. 8 is a schematic view showing a liquid crystal display device in embodiment 5 of the invention.

An example of the display device is a liquid crystal display device in an ADS mode or a TN mode for example; and as shown in FIG. 8, the liquid crystal display device comprises a liquid crystal panel 100. In the liquid crystal panel 100, an array substrate 200 and a counter substrate 300 are disposed opposite to each other so as to form a liquid crystal cell, which is sealed through a sealant 350; and in the liquid crystal cell, there is filled a liquid crystal material 400. The counter substrate 300 is a color filter substrate for example. For example, for the TN mode, on the counter substrate 300, there is formed a common electrode, serving to form liquid crystal capacitors together with pixel electrodes on the array substrate; for the ADS mode, on the counter substrate 300, it is possible that no common electrode is formed.

A pixel electrode for each pixel unit of the array substrate acts to apply an electric field for controlling the extent of rotation of the liquid crystal material, so as to conduct a display operation.

In some examples, the liquid crystal display device further comprises a backlight source for providing the array substrate with backlight.

The foregoing are merely exemplary embodiments of the invention, but are not used to limit the protection scope of the invention. The protection scope of the invention is determined by attached claims.

The invention claimed is:

1. A thin film transistor, comprising a gate electrode, a gate insulating layer, an active layer, an electrode metal layer and a passivation layer which are formed on a substrate; wherein the electrode metal layer comprises a source electrode and a drain electrode, and the source electrode and the drain electrode are separated from each other with a channel region being defined therebetween; between the active layer and the electrode metal layer, there is formed a second transparent conductive layer;
   wherein between the gate electrode and the substrate, there is formed a first transparent conductive layer; and
   wherein materials for the gate electrode and the electrode metal layer are copper; and between the first transparent conductive layer and the gate electrode and/or between the second transparent conductive layer and the electrode metal layer, respectively, there is formed a metal layer.

2. The thin film transistor claimed as claim 1, wherein the active layer is of an amorphous silicon material or an oxide semiconductor material.

3. The thin film transistor claimed as claim 1, wherein the first transparent conductive layer and/or the second transparent conductive layer are/is formed of zinc oxide, indium tin oxide, indium zinc oxide, polymer ethylenedioxy thiophene or a grapheme material.

4. An array substrate, comprising the thin film transistor claimed as claim 1.

5. The array substrate claimed as claim 4, wherein on the array substrate, there are provided a pixel electrode and a common electrode, the pixel electrode and the common electrode are disposed in different layers of the array substrate with an insulating layer being provided between the pixel electrode and the common electrode, and the pixel electrode is electrically connected to a source electrode or a drain electrode of the thin film transistor and in a slit configuration.

6. A display device, comprising the array substrate claimed as claim 1.

7. A manufacturing method of a thin film transistor, comprising the following steps:
   forming a gate electrode on a substrate, comprising forming a first transparent conductive layer on the substrate firstly to function as an adhesion enhancing layer between the gate electrode and the substrate;
   forming a gate insulating layer and an active layer on the gate electrode;
   forming a second transparent conductive layer on the gate insulating layer and the active layer, and a source electrode and a drain electrode that are located on the second transparent conductive layer and separated from each other; and forming a passivation layer on the source electrode, the drain electrode and the second transparent conductive layer;

wherein materials for the gate electrode and the electrode metal layer are copper; and between the first transparent conductive layer and the gate electrode and/or between the second transparent conductive layer and the electrode metal layer, respectively, there is formed a metal layer.

8. A manufacturing method of an array substrate, comprising the following steps:

forming a first transparent conductive layer and a pattern of a gate electrode, a pattern of a gate line, and a pattern of a gate line PAD area on a substrate in sequence;

forming a gate insulating layer and an active layer in sequence;

forming a second transparent conductive layer, a source electrode and a drain electrode that are separated from each other, a data line and a data line PAD area in sequence; and forming a passivation layer so as to expose the gate line PAD area and the data line PAD area;

wherein materials for the gate electrode and the electrode metal layer are copper; and between the first transparent conductive layer and the gate electrode and/or between the second transparent conductive layer and the electrode metal layer, respectively, there is formed a metal layer.

9. The manufacturing method of the array substrate claimed as claim 8, wherein the array substrate is of an ADS mode, and forming of the first transparent conductive layer and the pattern of the gate electrode, the pattern of the gate line, and the pattern of the gate line PAD area on the substrate in sequence comprises:

forming the first transparent conductive layer and a gate metal layer sequentially on the substrate;

forming a photoresist pattern with different heights on the gate metal layer; and conducting steps of exposure-and-development on the photoresist pattern, and etching the gate metal layer respectively after each exposure-and-development, so as to form the pattern of the gate electrode, the pattern of the gate line, the pattern of the gate line PAD area and a pattern of a common electrode.

10. The manufacturing method of the array substrate claimed as claim 8, wherein when the active layer is of an oxide semiconductor material, forming of the gate insulating layer and the active layer in sequence further comprises performing patterning onto a protective layer, and the method comprises:

depositing the gate insulating layer, the oxide semiconductor layer and the protective layer sequentially;

spin-coating photoresist on the protective layer;

conducting exposure-and-development with a half-tone or grey-tone mask plate, so that the photoresist in a region for the pattern of the protective layer is fully retained, and the photoresist in two contact areas for connection to the source electrode and the drain electrode are partially retained;

forming the pattern of the oxide semiconductor layer and the pattern of the protective layer through a multi-step etching process.

11. The manufacturing method of the array substrate claimed as claim 8, wherein when the active layer is of an amorphous silicon material, forming of the gate insulating layer and the active layer in sequence comprises:

depositing the gate insulating layer and the active layer that comprises an intrinsic layer and an N-type layer sequentially;

spin-coating photoresist on the N-type layer;

conducting exposure-and-development, so that the photoresist in a region for the pattern of the active layer is retained;

etching off the intrinsic layer and the N-type layer in a region where no photoresist is retained.

12. The manufacturing method of the array substrate claimed as claim 8, wherein forming of the second transparent conductive layer, the source electrode and the drain electrode that are separated from each other, the data line and the data line PAD area in sequence comprises:

performing patterning on the second transparent conductive layer and an electrode metal layer:

depositing the second transparent conductive layer and the electrode metal layer sequentially;

spin-coating photoresist on the electrode metal layer;

conducting exposure-and-development with a half-tone or grey-tone mask plate, so that the photoresist for the source electrode, the drain electrode and the data line, and the data line PAD area is fully retained, and the photoresist in a pixel electrode area is partially retained; and forming the source electrode, the drain electrode and the data line and the data line PAD area through a multi-step etching process.

13. The manufacturing method of the array substrate claimed as claim 12, wherein when the active layer is of an amorphous silicon material and comprises an intrinsic layer and an N-type layer sequentially, the method further comprises: etching off the N-type layer in a channel region.

* * * * *